(12) United States Patent
Noguchi (10) Patent No.: US 6,218,705 B1
(45) Date of Patent: Apr. 17, 2001

(54) SEMICONDUCTOR DEVICE HAVING PROTECTIVE ELEMENT TO CONDUCT CURRENT TO SUBSTRATE

(75) Inventor: Ko Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/317,158

(22) Filed: May 24, 1999

(30) Foreign Application Priority Data

Jun. 2, 1998 (JP) .................................................. 10-152785

(51) Int. Cl.[7] ..................................................... H01L 23/62

(52) U.S. Cl. ........................... 257/355; 257/356; 257/357; 257/360

(58) Field of Search ..................................... 257/546, 355, 257/356, 357, 358, 360, 363, 581

(56) References Cited

U.S. PATENT DOCUMENTS

| 3,673,428 | * | 6/1972 | Athanas | 361/111 |
|---|---|---|---|---|
| 3,748,547 | * | 7/1973 | Sugimoto | 257/363 |
| 4,503,448 | * | 3/1985 | Miyasaka | 257/363 |
| 5,844,282 | * | 12/1998 | Noguchi | 257/356 |

FOREIGN PATENT DOCUMENTS

| 62-102564 | 5/1987 | (JP) . |
|---|---|---|
| 1-253276 | 10/1989 | (JP) . |

* cited by examiner

Primary Examiner—Olik Chaudhuri
Assistant Examiner—Hoai Pham
(74) Attorney, Agent, or Firm—McGinn & Gibb, PLLC

(57) ABSTRACT

A semiconductor device includes a protective element which is formed on a semiconductor substrate and conducts current to the semiconductor substrate at a voltage lower than the breakdown voltage of an insulating layer formed between a gate electrode and the semiconductor substrate. The protective element is connected to a gate electrode of a MOS transistor formed on the semiconductor substrate.

19 Claims, 6 Drawing Sheets

SEMICONDUCTOR DEVICE HAVING PROTECTIVE ELEMENT TO CONDUCT CURRENT TO SUBSTRATE

BACKGROUND OF THE INVENTION

1. Field of the Invention

The present invention relates to a semiconductor device and, more particularly, to a semiconductor device having a MOS transistor designed to prevent damage to the insulating film of a gate electrode in a plasma process and the like.

2. Description of the Prior Art

Conventionally, many plasma processes are used in a semiconductor device manufacturing process. In a plasma process, a voltage is applied to an electrode. This damages a gate insulating film of a MOS device, and results in a decrease in the yield of LSIs or a deterioration in reliability. This problem will be described below by taking a transistor for checking/measuring device characteristics as an example.

Figure 1:
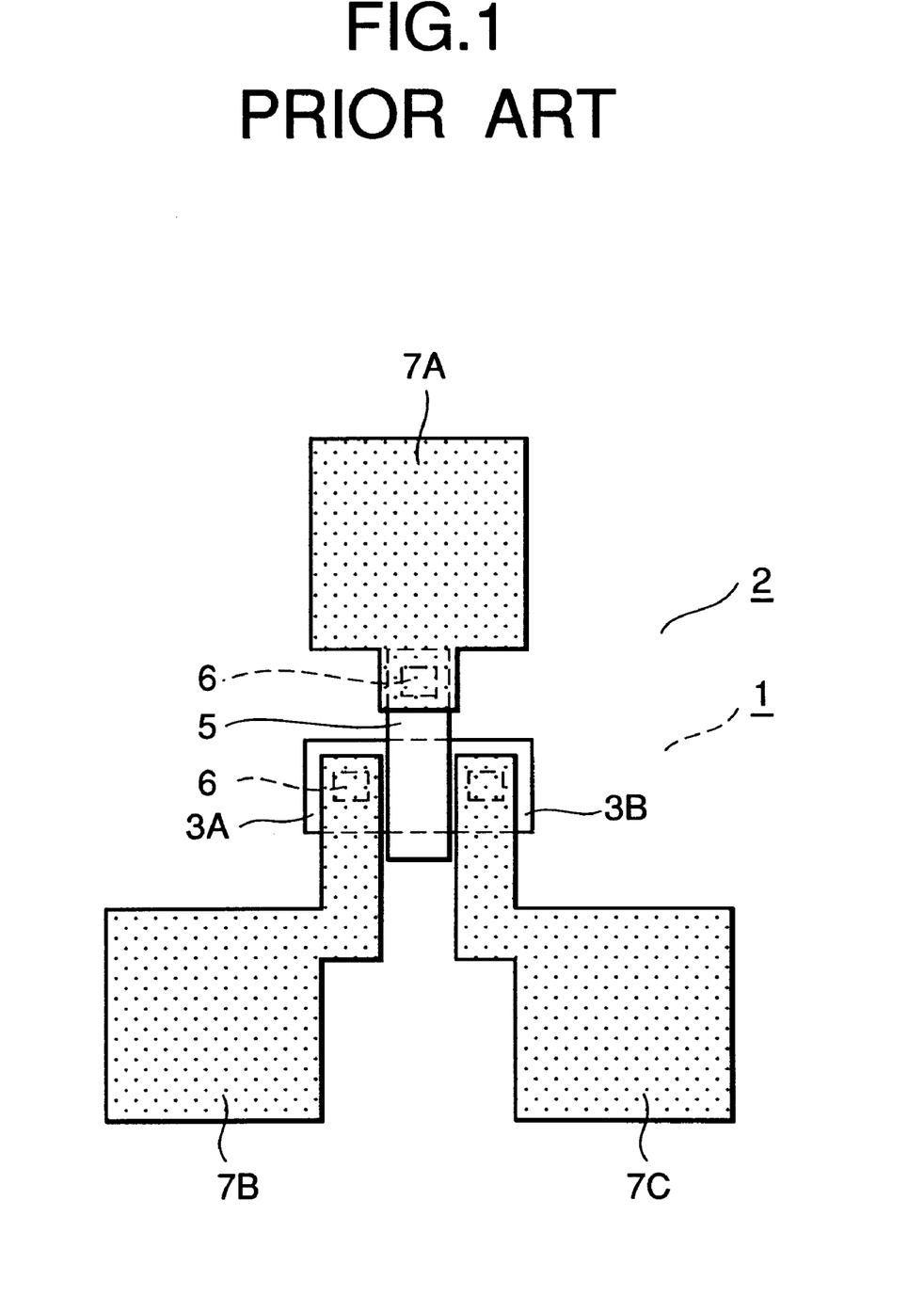
FIG. 1 is plan view showing a first conventional transistor.

FIG. 1 is a plan view of a measurement transistor. A measurement transistor has a diffusion region formed in that region on a P-type substrate 1, which is surrounded by a field insulating film 2. A gate electrode 5 is formed across this diffusion region. Regions adjacent to the gate electrode 5 in the diffusion region serve as heavily-doped N-type diffusion regions 3A and 3B. Probe pads 7A, 7B, and 7C are respectively connected to contacts 6 formed on the gate electrode 5 and the heavily-doped N-type diffusion regions 3A and 3B.

The pads 7A, 7B, and 7C are respectively used for gate, source, and drain electrodes. During plasma etching of the pad electrode, charge flows into the gate electrode 5 through each pad, resulting in a deterioration in the gate insulating film. Since the area of each pad is relatively large with the length of one side ranging from 50 µm to 100 µm, damage caused by the plasma cannot be neglected.

Figure 2:
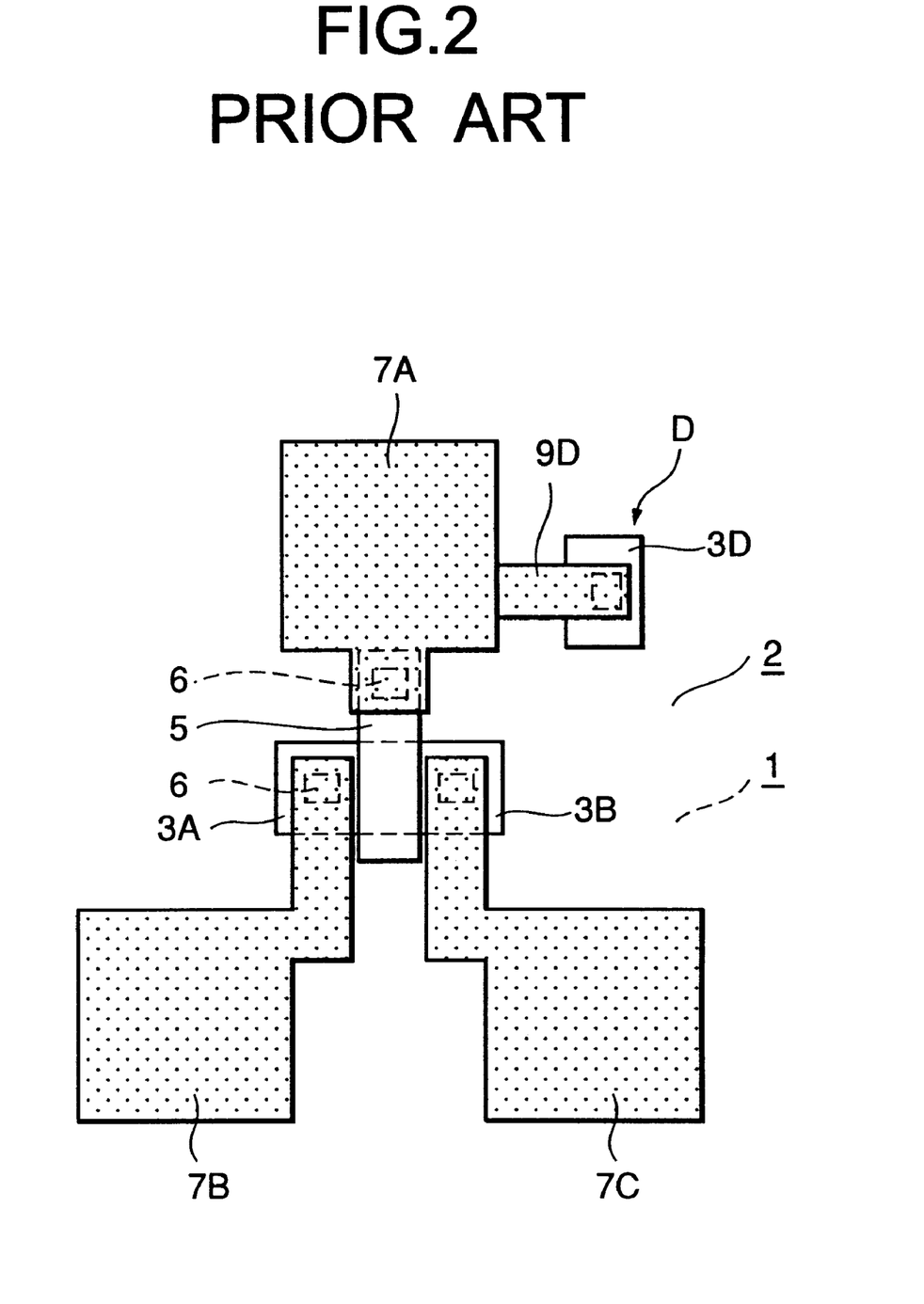
FIG. 2 is a plan view showing a second conventional transistor.

As shown in FIG. 2, a protective diode D may be formed to prevent charge buildup on the gate electrode 5 through the pad 7A. Referring to FIG. 2, the pad 7A for the gate electrode is connected to a heavily-doped N-type diffusion region 3D through an interconnection 9D. Since the P-type substrate 1 is located below the heavily-doped N-type diffusion region, the gate pad 7A is connected to the heavily-doped N/P-type diode D. As a consequence, the charge built up on the gate electrode 5 can be released to the P-type substrate 1.

A structure in which the diode or transistor of an input/output protective circuit is made of polysilicon is disclosed in Japanese Unexamined Patent Publication No. 1-253276.

As the size of the semiconductor device decreases, however, the thickness of the gate insulating film is reduced, and the breakdown voltage of the gate insulating film gradually decreases. On the other hand, the breakdown voltage of the protective diode hardly changes because the voltage is determined by the impurity concentrations of the diffusion region and its adjacent well. For this reason, when the thickness of the gate insulating film becomes about 8 nm or less, the breakdown voltage of the protective diode becomes higher than that of the gate insulating film. The diode having the conventional structure cannot therefore provide sufficient protection.

This state will be described below with reference to FIG. 3.

Figure 3:
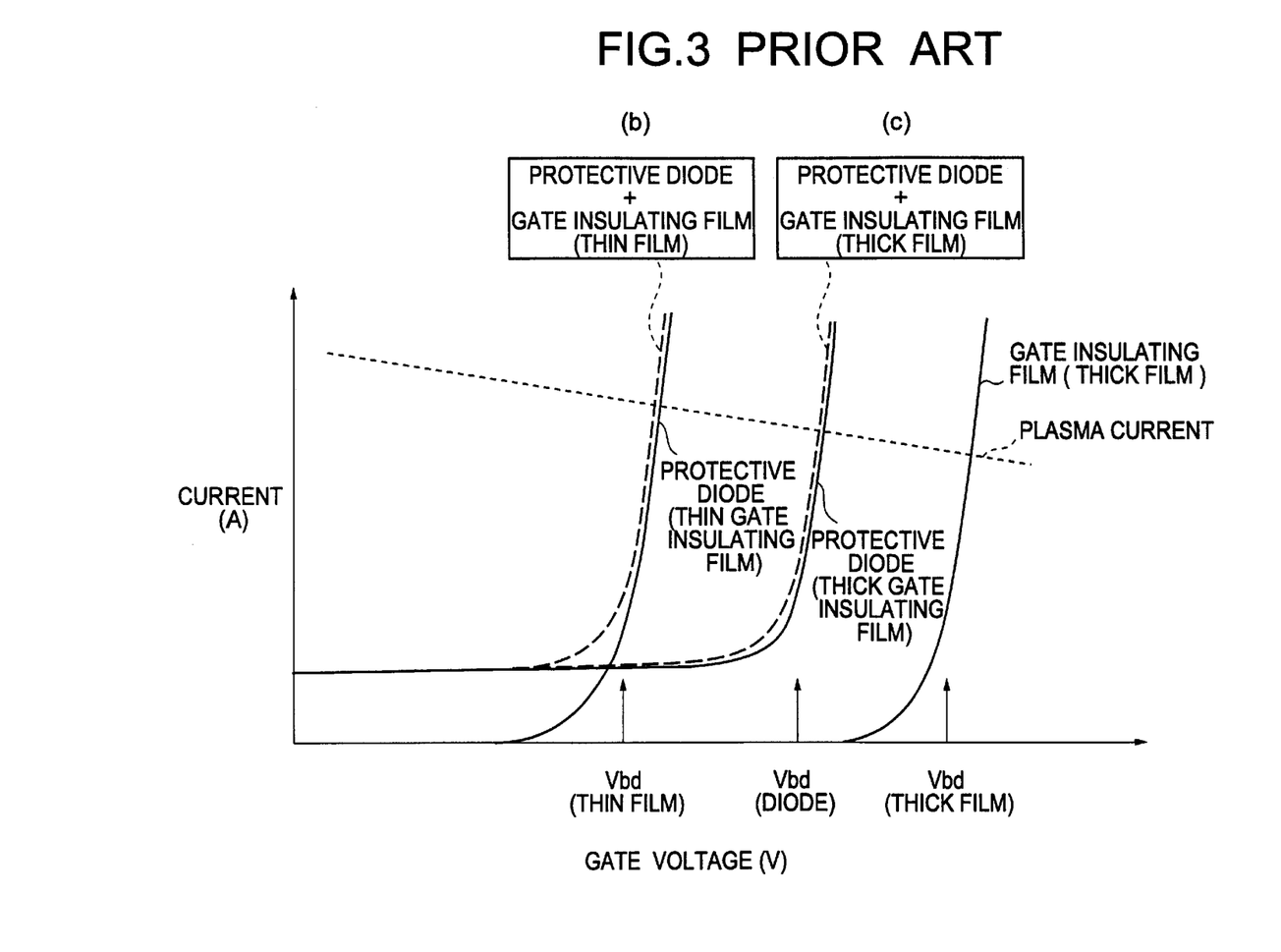
FIG. 3 is a graph showing the relationship between the gate voltage and the gate current and characteristics of a diode.

FIG. 3 shows the relationship between "gate voltage" and "gate current" and the characteristics of a diode when a thick gate insulating film is formed. Referring to FIG. 3, the abscissa represents the gate voltage with reference to the substrate voltage. A current flowing in the gate insulating film is tunneling current and abruptly increases at a given voltage or higher. Upon application of a positive voltage, the diode is reverse-biased. Hence, a breakdown occurs at a given voltage, and the current flowing in the diode abruptly increases. In a plasma process, plasma light generates carriers in the substrate. As a result, a leakage current that does not have much dependence on voltage flows. This behavior is expressed as diode characteristic in FIG. 3.

Assume that Vbd (thick film), Vbd (thin film), and Vbd (diode) respectively represent the breakdown voltage of the gate insulating film (thick film), the breakdown voltage of the gate insulating film (thin film), and the breakdown voltage of the diode. When the gate insulating film is thick, Vbd (diode)<Vbd (thick film). When, therefore, the gate electrode is connected to the diode, the characteristic represented by a dashed line (c) in FIG. 3 is obtained. The current flowing from the plasma and the gate voltage have a predetermined relationship. This characteristic is represented as the plasma current (dotted line) in FIG. 3. The plasma current does not have much dependence on the gate voltage and can be approximately regarded as a constant current. Since most of the current from the plasma flows into the diode, no damage occurs.

As the thickness of the gate insulating film is reduced, the breakdown voltage decreases, and Vbd (diode)>Vbd (thin film). As a consequence, the characteristic represented by the dashed line (b) in FIG. 3 appears, and most of the current from the plasma flows into the gate insulating film, resulting in damage to the gate insulating film. That is, the thin gate insulating film cannot be effectively protected by the diode in the prior art.

SUMMARY OF THE INVENTION

The present invention has been made in consideration of the above situation in the prior art, and has as its object to provide a semiconductor device having a MOS transistor which suppresses damage to its gate insulating film connected to an interconnection when charge builds up on the interconnection by a plasma during a plasma process for the interconnection.

In order to achieve the above object, according to the principal aspect of the present invention, there is provided a semiconductor device comprising a protective element which is formed on a semiconductor substrate and conducts current to the semiconductor substrate at a voltage lower than a breakdown voltage of an insulating layer formed between a gate electrode and the semiconductor substrate, the protective element being connected to a gate electrode of a MOS transistor formed on the semiconductor substrate.

The principal aspect includes the following auxiliary aspects.

According to the first auxiliary aspect of the present invention, the protective element comprises a gate electrode and two heavily-doped N-type diffusion regions adjacent to two sides of the gate electrode, and one of the heavily-doped N-type diffusion regions is connected to the gate electrode of the MOS transistor, while the other heavily-doped N-type diffusion region is connected to the semiconductor substrate.

According to the second auxiliary aspect of the present invention, the gate electrode of the protective element has an area equal to or larger than that of the gate electrode of the MOS transistor.

According to the third auxiliary aspect of the present invention, a conductive portion that conducts current to the semiconductor substrate at a voltage lower than a breakdown voltage of an insulating layer formed between the gate electrode and the semiconductor substrate is connected to the gate electrode of the protective element.

The MOS transistor in each aspect described above is a semiconductor device for characteristic measurement.

As is obvious from the respective aspects, according to the present invention, the protective element that conducts current during a plasma process is connected to the gate electrode to allow charge flowing from the plasma to escape to the substrate through the protective element, thereby effectively preventing charge buildup on the gate electrode by the plasma. This can prevent damage to the electrode. In addition, this effect remains unchanged regardless of the thickness of the gate insulating film. The same effect can therefore be obtained even with a very thin gate insulating film. This prevents charge buildup on the gate electrode in the MOS transistor, and hence prevents damage to the insulating film.

Furthermore, when the present invention is applied to a MOS transistor for characteristic measurement, characteristics can be accurately measured without being influenced by the protective element.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

Figure 4:
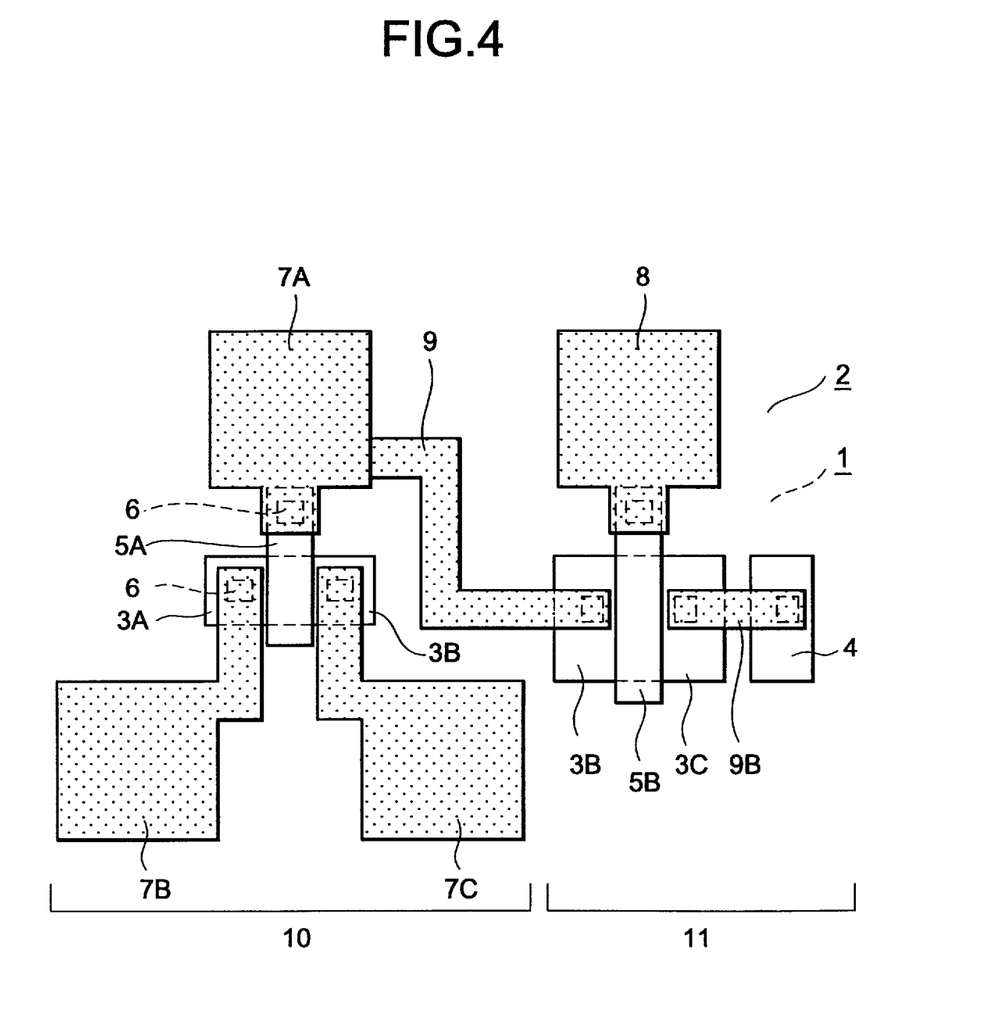
FIG. 4 is a plan view showing a transistor according to an embodiment of the present invention.
Figure 5:
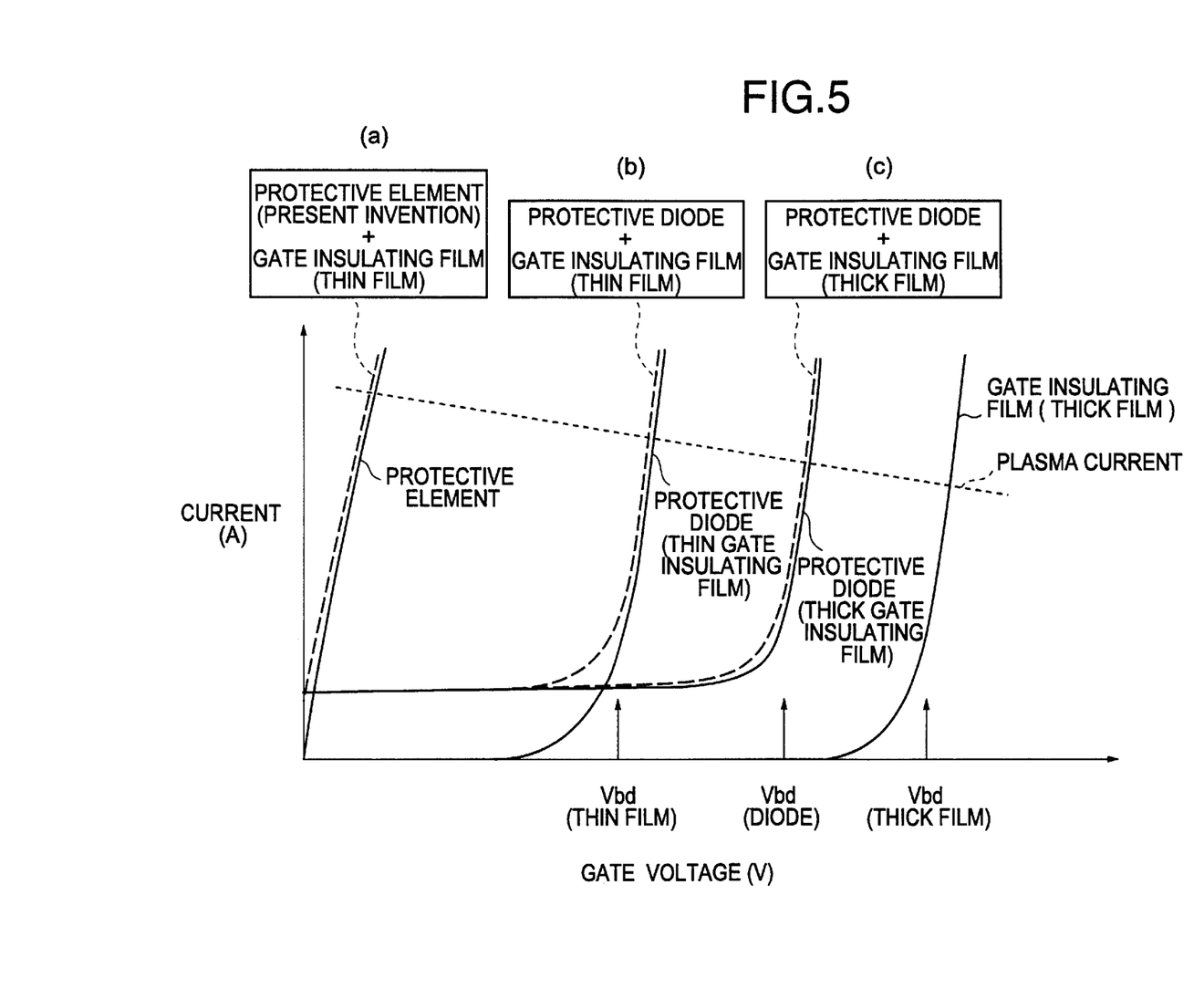
FIG. 5 is a graph showing the relationship between the gate voltage and the gate current and the characteristics of a diode in an embodiment of the present invention in comparison with those in the prior art.
Figure 6:
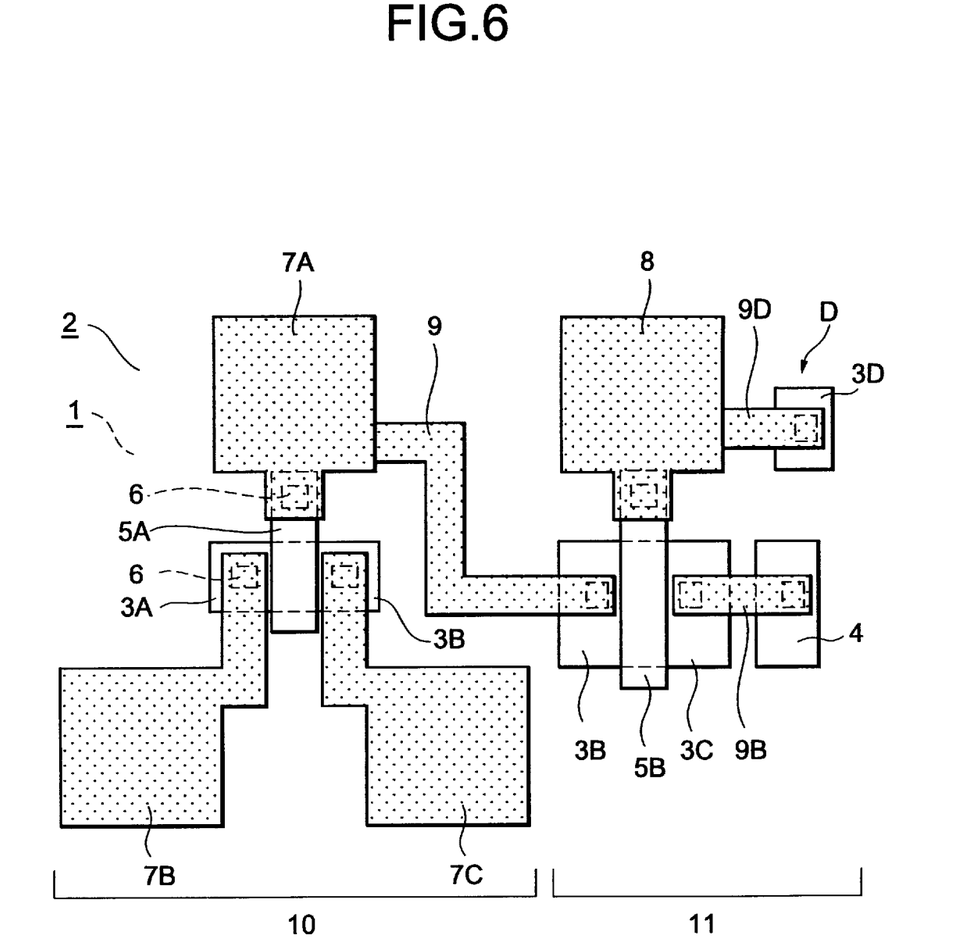
FIG. 6 is a plan view showing a transistor according to another embodiment of the present invention.

Preferred embodiments of the present invention will be described below with reference to the accompanying drawing (FIGS. 4 to 6).

FIG. 4 shows a MOS transistor 10 according to the first embodiment of the present invention and a protective element 11.

The MOS transistor 10 is comprised of a gate electrode 5A, heavily-doped N-type diffusion regions 3A and 3B, probe pads 7A, 7B, and 7C, and the like, and has a structure similar to that of the prior art shown in FIG. 1. The protective element 11 is connected to the gate electrode pad 7A. The structure of this protective element 11 will be described below.

The protective element 11 has a gate electrode 5B and heavily-doped N-type diffusion regions 3B and 3C formed adjacent to the gate electrode 5B. The gate electrode 5B is connected to a pad 8 through a contact 6. The heavily-doped N-type diffusion region 3B is connected to the gate pad 7A of the MOS transistor 10. The heavily-doped N-type diffusion region 3C is connected to a heavily-doped p-type diffusion region 4, which is formed away from the region 3C, through an interconnection 9B. The gate electrode 5A of the MOS transistor 10 is connected to the heavily-doped N-type diffusion region 3B of the protective element 11 through an interconnection 9.

The charge built up on the pad 7A in a plasma process or the like flows into the heavily-doped N-type diffusion region 3B of the protective element 11 through the interconnection 9. This increases the potential of the heavily-doped N-type diffusion region 3B. At the same time, charge builds up on the pad 8 for the gate electrode 5B of the protective element 11 in the same manner, and its potential increases. As a result, the protective element 11 is turned on.

Operation of the first embodiment will be described next.

When plasma etching for interconnections is performed, charge build up on the gate pad 7A of the MOS transistor 10 and the gate pad 8 of the protective element 11 to almost the same level because the pads have the same size. For this reason, the potentials of the respective pads become almost equal. The potentials at this time are generally several volts or higher. On the other hand, since the threshold voltage of the protective element 11 is generally one volt or lower, the channel of the protective element 11 is turned on when charge builds up on the pad 8. In addition, the potential of the heavily-doped N-type diffusion region 3B connected to the pad 7A becomes higher than that of the heavily-doped N-type diffusion region 3C by several volts or higher. For this reason, current conducts between the heavily-doped N-type diffusion region 3B of the protective element 11 and the heavily-doped N-type diffusion region 3C. The charge built upon on the gate electrode 5A of the MOS transistor 10 flows into the P-type substrate 1 through the channel of the protective element 11 and the heavily-doped P-type diffusion region 4.

According to the characteristics obtained when the channel of the protective element 11 is turned on, as shown in FIG. 5, the channel current abruptly increases with an increase in gate voltage. That is, the protective element 11 behaves like a resistor connected to the P-type substrate 1, and the charge flowing into the gate electrode pad 7A of the protective element 11 flows into the substrate according to the characteristics indicated by "(a)" in FIG. 5.

Note that the current flowing from the plasma and the gate voltage have a predetermined relationship, which is indicated as a plasma current (dotted line) in FIG. 5. The plasma current does not have much dependence on the gate current and can be approximately regarded as a constant current. That is, charging by the plasma can be prevented by forming a path through which the current escapes.

In this manner, charge buildup on the gate electrode of the MOS transistor 10 is prevented, thereby preventing damage to the gate oxide film.

In measuring the characteristics of the MOS transistor after completion of the manufacturing process, since the channel of the protective element 11 is turned off when the potential of the pad 8 of the protective element 11 is set to be equal to that of the P-type substrate 1, the gate electrode 5A of the MOS transistor 10 is connected to only the diode (heavily-doped N-type diffusion region 3B). Measurement can therefore be performed without any problem.

In addition, since charge builds up on the gate electrode 5B of the protective element 11 by the plasma, like the gate electrode 5A of the MOS transistor 10, the gate insulating film of the protective element 11 may be damaged. To prevent this, it is preferable to increase the channel width and channel length of the protective element 11 and to decrease the antenna ratio. In addition, when the threshold voltage of the protective element 11 is set to be lower than that of the MOS transistor 10, the protective element 11 can be easily turned on. This improves the protective effect.

The second embodiment of the present invention will be described next with reference to FIG. 6.

If the amount of charge flowing from a plasma is excessively large, the gate insulating film of the protective element 11 may be damaged and destroyed. In such a case, no protective effect can be expected. For this reason, protection by a diode is added to reduce the plasma damage to the protective element 11 itself.

FIG. 6 is a plan view of a MOS transistor according to the second embodiment. The second embodiment differs from the first embodiment in that an interconnection 9D is connected to a pad 8 for a gate electrode 5B of a protective element 11, and a pad 8 is connected to a heavily-doped N-type diffusion region 3D through the interconnection 9D. A diode D is therefore formed by the protective element 11. When charge builds up on the gate electrode 5B of the protective element 11, the diode D breaks down to allow the charge in the gate electrode 5B to escape into the P-type substrate 1.

Even if the diode is added to the protective element 11 in this manner, the characteristics of the element do not change, and hence the same protection performance as that in the first embodiment can be expected, as indicated by "(a)" in FIG. 5.

In the second embodiment, the MOS transistor is described as an estimation transistor. However, the present invention is not limited to this. Even in general MOS transistors used in integrated circuits, when long interconnections are connected to gate electrodes, the same problem concerning charge buildup as that described above arises. Therefore, the influences of charge buildup can be prevented by applying the present invention to such circuits.

What is claimed is:

1. A semiconductor device comprising:
   a substrate; and
   a protective element formed on said substrate and connected to a gate electrode of a transistor formed on said substrate,
   wherein an insulating layer is formed between said gate electrode and said substrate, and
   wherein said protective element conducts current to said substrate at a voltage lower than a breakdown voltage of said insulating layer.

2. A device according to claim 1, wherein said protective element comprises:
   a gate electrode; and
   two heavily doped N-type diffusion regions adjacent to two sides of said gate electrode,
   wherein one of said heavily doped N-type diffusion regions is connected to said gate electrode of said transistor, and the other heavily doped N-type diffusion region is connected to said substrate.

3. A device according to claim 2, wherein said gate electrode of said protective element has an area equal to an area of said gate electrode of said transistor.

4. A device according to claim 2, wherein said gate electrode of said protective element has an area larger than an area of said gate electrode of said transistor.

5. A device according to claim 2, further comprising a conductive portion which is connected to said gate electrode of said protective element and conducts current to said substrate at a voltage lower than a breakdown voltage of said insulating layer.

6. A device according to claim 3, further comprising a conductive portion which is connected to said gate electrode of said protective element and conducts current to said substrate at a voltage lower than a breakdown voltage of said insulating layer.

7. A device according to claim 4, further comprising a conductive portion which is connected to said gate electrode of said protective element and conducts current to said substrate at a voltage lower than a breakdown voltage of said insulating layer.

8. A device according to claim 1, wherein said transistor comprises a semiconductor device for characteristic measurement.

9. A device according to claim 2, wherein said transistor comprises a semiconductor device for characteristic measurement.

10. A device according to claim 3, wherein said transistor comprises a semiconductor device for characteristic measurement.

11. A device according to claim 4, wherein said transistor comprises a semiconductor device for characteristic measurement.

12. A device according to claim 1, wherein said transistor comprises a MOS transistor.

13. A semiconductor device according to claim 1, wherein said protective element has a smaller volume than said transistor.

14. A semiconductor device according to claim 1, wherein a thickness of said insulating layer is less than about 8 nm.

15. A semiconductor device according to claim 1, wherein said protective element conducts current into said substrate and prevents charge buildup on said gate electrode of said transistor.

16. A semiconductor device according to claim 1, wherein a threshold voltage of said protective element is equal to or less than about one volt.

17. A semiconductor device according to claim 1, wherein a threshold voltage of said protective element is lower than a threshold voltage of said transistor.

18. A semiconductor device comprising:
   a substrate; and
   a protective element formed on said substrate and connected to a gate electrode of a MOS transistor formed on said substrate, said protective element comprising:
      a gate electrode; and
      two heavily doped N-type diffusion regions adjacent to two sides of said gate electrode,
      wherein one of said heavily doped N-type diffusion regions is connected to said gate electrode of said transistor, and the other heavily doped N-type diffusion region is connected to said substrate,
   wherein an insulating layer is formed between said gate electrode of said MOS transistor and said substrate, and
   wherein said protective element conducts current to said substrate at a voltage lower than a breakdown voltage of said insulating layer, and
   wherein said gate electrode of said protective element has an area equal to an area of said gate electrode of said MOS transistor.

19. A semiconductor device comprising:
a substrate; and
a protective element formed on said substrate and connected to a gate electrode of a MOS transistor formed on said substrate, said protective element comprising:
   a gate electrode; and
   two heavily doped N-type diffusion regions adjacent to two sides of said gate electrode,
   wherein one of said heavily doped N-type diffusion regions is connected to said gate electrode of said transistor, and the other heavily doped N-type diffusion region is connected to said substrate,
   wherein an insulating layer is formed between said gate electrode of said MOS transistor and said substrate, and
   wherein said protective element conducts current to said substrate at a voltage lower than a breakdown voltage of said insulating layer, and
   wherein said gate electrode of said protective element has an area larger than an area of said gate electrode of said MOS transistor.

* * * * *